United States Patent
Jang et al.

(10) Patent No.: US 8,299,517 B2
(45) Date of Patent: Oct. 30, 2012

(54) SEMICONDUCTOR DEVICE EMPLOYING TRANSISTOR HAVING RECESSED CHANNEL REGION AND METHOD OF FABRICATING THE SAME

(75) Inventors: Sung-Ho Jang, Gyeonggi-do (KR); Yong-Jin Choi, Gyeonggi-do (KR); Min-Sung Kang, Gyeonggi-do (KR); Kwang-Woo Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 718 days.

(21) Appl. No.: 12/034,482

(22) Filed: Feb. 20, 2008

(65) Prior Publication Data

US 2008/0203455 A1     Aug. 28, 2008

(30) Foreign Application Priority Data

Feb. 23, 2007   (KR) .................. 10-2007-0018442

(51) Int. Cl.
*H01L 27/108* (2006.01)

(52) U.S. Cl. . 257/306; 257/301; 257/302; 257/E27.091; 438/243

(58) Field of Classification Search .............. 257/301, 257/302, E27.091; 438/243
See application file for complete search history.

(56) References Cited

U.S. PATENT DOCUMENTS

| | | | |
|---|---|---|---|
| 6,075,269 A | 6/2000 | Terasawa et al. | |
| 6,476,444 B1 | 11/2002 | Min | |
| 7,345,338 B1 * | 3/2008 | Han et al. | 257/330 |
| 2004/0188739 A1 * | 9/2004 | Takenaka et al. | 257/301 |
| 2004/0228067 A1 * | 11/2004 | Gutsche et al. | 361/306.2 |
| 2005/0020086 A1 * | 1/2005 | Kim et al. | 438/700 |
| 2006/0289931 A1 * | 12/2006 | Kim et al. | 257/330 |

FOREIGN PATENT DOCUMENTS

| | | |
|---|---|---|
| KR | 10-2006-0023308 | 3/2006 |
| KR | 10-0589056 | 6/2006 |
| KR | 10-0628378 | 9/2006 |
| KR | 10-2007-0019242 | 2/2007 |

OTHER PUBLICATIONS

English language abstract of Korean Publication No. 10-2006-0023308.
English language abstract of Korean Publication No. 10-0589056.
English language abstract of Korean Publication No. 10-0628378.
Decision of Grant issued May 28, 2008 in Korean Patent Application No. 10-2007-0018442.

* cited by examiner

*Primary Examiner* — Thao Le
*Assistant Examiner* — Matthew Gordon
(74) *Attorney, Agent, or Firm* — Volentine & Whitt, PLLC (57) ABSTRACT

A semiconductor device employing a transistor having a recessed channel region and a method of fabricating the same is disclosed. A semiconductor substrate has an active region. A trench structure is defined within the active region. The trench structure includes an upper trench region adjacent to a surface of the active region, a lower trench region and a buffer trench region interposed between the upper trench region and the lower trench region. A width of the lower trench region may be greater than a width of the upper trench region. An inner wall of the trench structure may include a convex region interposed between the upper trench region and the buffer trench region and another convex region interposed between the buffer trench region and the lower trench region. A gate electrode is disposed in the trench structure. A gate dielectric layer is interposed between the gate electrode and the trench structure.

20 Claims, 6 Drawing Sheets

SEMICONDUCTOR DEVICE EMPLOYING TRANSISTOR HAVING RECESSED CHANNEL REGION AND METHOD OF FABRICATING THE SAME

CROSS-REFERENCE TO RELATED APPLICATIONS

This application claims the benefit of Korean Patent Application No. 10-2007-0018442, filed on Feb. 23, 2007, the contents of which are hereby incorporated herein by reference in their entirety.

BACKGROUND

1. Field of Invention

Embodiments of the present invention generally relate to semiconductor devices and methods of fabricating the same and, more particularly, to a semiconductor device employing a transistor having a recessed channel region and a method of fabricating the same.

2. Description of Related Art

Owing to the increased demand for highly integrated semiconductor devices, laborious research has been conducted on minimizing the dimensions of transistors. When the plane dimension of a gate electrode is reduced to downscale the transistor, off-current may increase due to a short channel effect (SCE) and refresh characteristics of a memory device may deteriorate. In order to prevent the performance of a MOS transistor from deteriorating due to an SCE, a recess-channel transistor having an effective channel length greater than a horizontal dimension of a gate electrode has been proposed.

An example of the recess-channel transistor has been disclosed by Min in U.S. Pat. No. 6,476,444 B1 entitled "Semiconductor Device and Method for Fabricating the Same" (hereinafter "Min"). Min can be understood to disclose wherein a gate trench is formed in an active region of a semiconductor substrate. The gate trench includes a first gate trench having a generally square section and a second gate trench connected to the first gate trench and having an elliptical section. Thereafter, a gate dielectric layer is formed using a thermal oxidation process on an inner wall of the gate trench. A gate electrode is then formed on the gate dielectric layer to fill the gate trench. Since the second gate trench has an elliptical section, a MOS transistor can include a sufficient channel region. In other words, the MOS transistor can have an increased effective channel length. However, the second gate trench has a much greater width than the first gate trench to increase the effective channel length of the MOS transistor, so that right-angled corners are formed at a boundary region between the first and second gate trenches. Generally, when a gate dielectric layer is formed by a thermal oxidation process, the gate dielectric layer is formed thinner at a right angled corner than on a plane surface of an active region. Therefore, the gate dielectric layer is formed thinner at the boundary region between the first and second gate trenches than on an inner wall of the second gate trench. Also, when the MOS transistor operates, an electric field crowding effect may occur at the boundary region between the first and second gate trenches. The effect field crowding effect leads to the generation of a gate induced drain leakage (GIDL) current. As a result, data retention characteristics of a semiconductor device such as a DRAM may deteriorate due to the GIDL current. Furthermore, it is difficult to ensure the reliability of the gate dielectric layer formed at the boundary region between the first and second gate trenches.

SUMMARY

Embodiments exemplarily described herein provide a semiconductor device employing a MOS transistor having a recessed channel region and a method of fabricating the same.

One embodiment exemplarily described herein can be characterized as a semiconductor device that includes a semiconductor substrate having active region and a trench structure defined within the active region. The trench structure may include an upper trench region adjacent to a surface of the active region, a lower trench region and a buffer trench region interposed between the upper trench region and the lower trench region. Width of the lower trench region may be greater than a width of the upper trench region. An inner wall of the trench structure may include a convex region interposed between the upper trench region and the buffer trench region and another convex region interposed between the buffer trench region and the lower trench region. A gate electrode may be disposed in the trench structure. A gate dielectric layer may be interposed between the gate electrode and the trench structure.

Another embodiment exemplarily described herein can be characterized as a method of fabricating a semiconductor device that includes forming a trench structure in an active region of a semiconductor substrate. The trench structure may include an upper trench region adjacent to a surface of the active region, a lower trench region and a buffer trench region interposed between the upper trench region and the lower trench region. A width of the lower trench region may be greater than a width of the upper trench region. An inner wall of the trench structure may include a convex region interposed between the upper trench region and the buffer trench region and another convex region interposed between the buffer trench region and the lower trench region. A gate dielectric layer may be formed on the semiconductor substrate having the trench structure. A gate electrode may be formed on the gate dielectric layer to fill the trench structure.

BRIEF DESCRIPTION OF THE DRAWINGS

The foregoing and other objects, features and advantages of the invention will be apparent from the more particular description of exemplary embodiments of the invention, as illustrated in the accompanying drawings. The drawings are not necessarily to scale, emphasis instead being placed upon illustrating the principles of the invention.

DETAILED DESCRIPTION

Exemplary embodiments of the present invention will now be described more fully hereinafter with reference to the accompanying drawings. These embodiments may, however, be realized in different forms and should not be construed as limited to the embodiments set forth herein. Rather, these embodiments are provided so that this disclosure is thorough and complete and fully conveys the scope of the invention to those skilled in the art. In the drawings, the thicknesses of layers and regions are exaggerated for clarity. The same reference numerals are used to denote the same elements.

Figure 7:
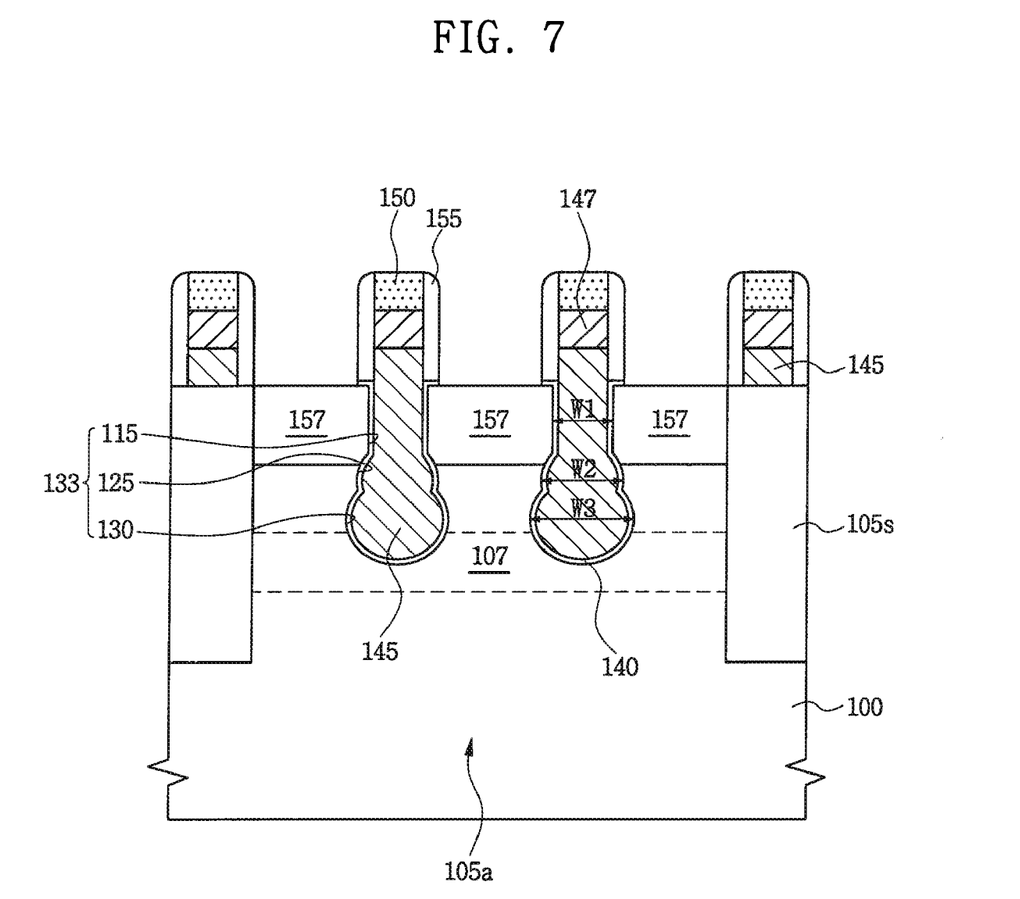
Figure 8:
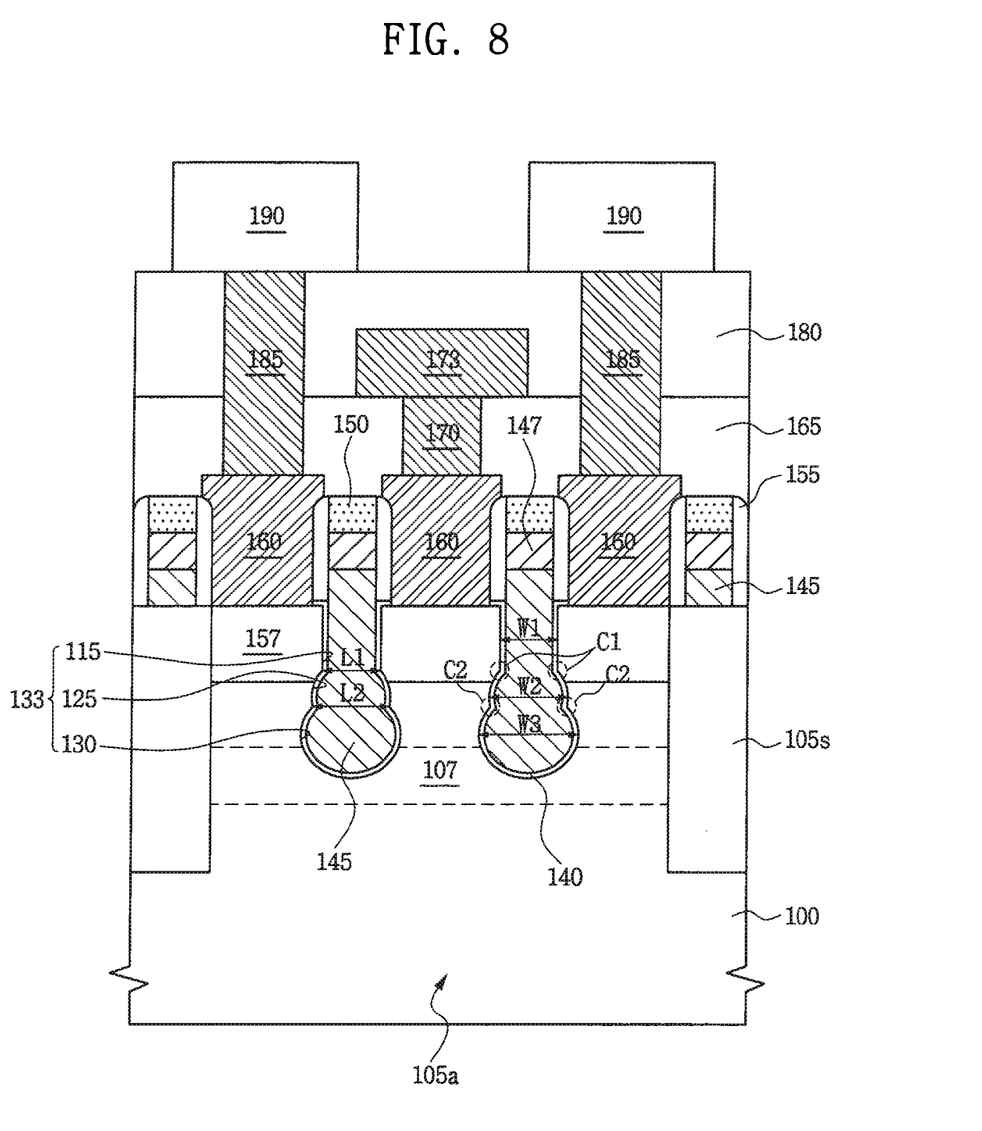
Figure 9:
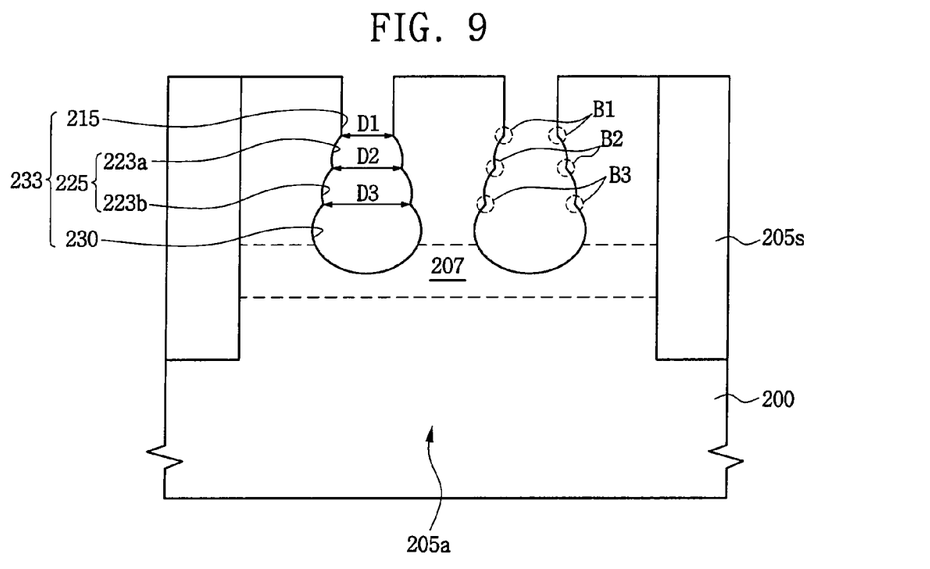
FIGS. 9 and 10 are cross-sectional views illustrating an exemplary method of fabricating a semiconductor device according to another embodiment.
Figure 10:
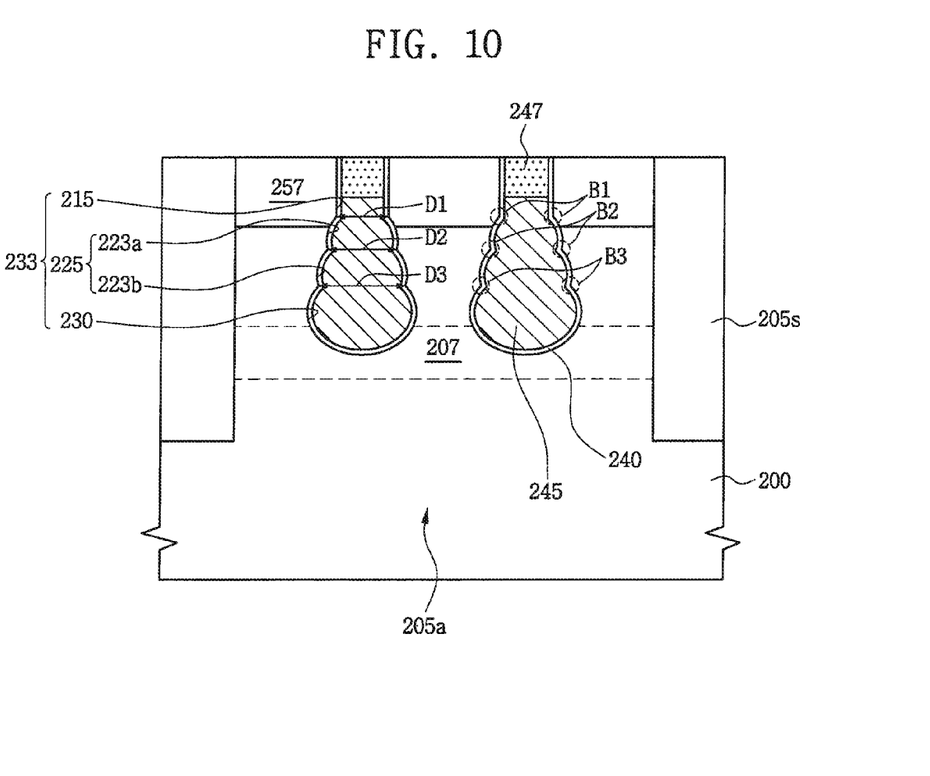

FIGS. 1 through 8 are cross-sectional views illustrating an exemplary method of fabricating a semiconductor device according to one embodiment. FIGS. 9 and 10 are cross-sectional views illustrating an exemplary method of fabricating a semiconductor device according to another embodiment.

A structure of a semiconductor device according to one embodiment of the present invention will first be described with reference to FIG. 8. Referring to FIG. 8, an isolation layer 105s may be disposed in a semiconductor substrate 100 to define an active region 105a. The active region 105a may have n-type or p-type conductivity. The isolation layer 105s may be a shallow trench isolation (STI) layer. The semiconductor substrate 100 may be a single crystalline silicon substrate. A trench structure 133 may be disposed in the active region 105a of the semiconductor substrate 100. The trench structure 133 may include at least three trench regions, which are sequentially arranged below the surface of the active region 105a of the semiconductor substrate 100 and have different widths. Trench regions that are disposed at lower levels below the surface of the active region 105a may generally have greater widths than trench regions disposed thereabove. Also, a boundary region between trench regions disposed at lower levels may generally have a greater width than a boundary region between trench regions disposed thereabove. For example, the trench structure 133 may include an upper trench region 115, a buffer trench region 125, and a lower trench region 130. The upper trench region 115 may be disposed across the active region 105a and the buffer trench region 125 may be disposed under the upper trench region 115. Accordingly, the trench structure 133 may cross the active region 105a. The buffer trench region 125 may have a greater width than the upper trench region 115. The lower trench region 130 may be disposed under the buffer trench region 125 and may have a greater width than the buffer trench region 125. A width L1 of a first boundary region between the upper trench region 115 and the buffer trench region 125 may be smaller than a width L2 of a second boundary region between the buffer trench region 125 and the lower trench region 130. The buffer trench region 125 may prevent the upper and lower trench regions 115 and 130 from directly contacting each other. Accordingly, the buffer trench region 125 may prevent a sharp corner from being formed between the upper and lower trench regions 115 and 130. Thus, the trench structure 133 has dull corners C1 and C2 disposed at different levels along an inner wall thereof. The upper trench region 115 may have a substantially vertical sidewall. The buffer trench region 125 may have a curved sidewall. The lower trench region 130 may have a curved sidewall. In one embodiment, the lower trench region 130 may also have a curved bottom region.

As described above, the trench structure 133 includes at least three trench regions, which are sequentially arranged from the surface of the active region 105a and have different widths. The trench structure 133 may include a plurality of buffer trench regions with different widths. Therefore, although not shown in the drawings, at least one additional buffer trench region may be disposed between the upper trench region 115 and the buffer trench region 125 and/or an additional buffer trench region may be disposed between the buffer trench region 125 and the lower trench region 130. Accordingly, at least one buffer trench region 125 may be provided between the upper and lower trench regions 115 and 130 to prevent sharp corners from being formed between the upper and lower trench regions 115 and 130.

A gate electrode 145 may be disposed in the trench structure 133. Meanwhile, the gate electrode 145 may fill the trench structure 133 and protrude from the surface of the active region 105a. The gate electrode 145 may include, for example, doped polysilicon. A gate dielectric layer 140 may be disposed between the gate electrode 145 and the trench structure 133. The gate dielectric layer 140 may include, for example, silicon oxide, a high-k dielectric material, or the like or a combination thereof.

A metal silicide pattern 147 may be disposed on the gate electrode 145 protruding from the surface of the active region 105a. A capping mask 150 may be disposed on the metal silicide pattern 147. A gate spacer 155 may be disposed on a sidewall of the capping mask 150, a sidewall of the metal silicide pattern 147, and a sidewall of the protruding portion of the gate electrode 145. Source and drain regions 157 may be disposed in the active region 105a on both sides of the gate electrode 145. The source and drain regions 157 may have a different conductivity type from the active region 105a.

A threshold voltage control region 107 may be disposed in the active region 105a. The threshold voltage control region 107 may have a different conductivity type from the source and drain regions 157. The threshold voltage control region 107 may have the same conductivity type as the active region 105a and a different impurity concentration from the active region 105a. For example, the threshold voltage control region 107 may have a higher impurity concentration than the active region 105a. The threshold voltage control region 107 may surround a bottom region of the trench structure 133. Accordingly, the bottom region of the lower trench region 130 may be disposed in the threshold voltage control region 107.

As exemplarily described above, a MOS transistor having a recessed channel region may be provided in the active region 105a. As illustrated, the gate electrode 145 is disposed in a plurality of trench regions having widths that increase with increasing depth below the surface of the active region 105a. For example, the gate electrode 145 is disposed in the upper trench region 115, at least one buffer trench region 125, and the lower trench region 130 so that the recessed channel region is formed. The recessed channel region prevents the performance of the MOS transistor from deteriorating due to an SCE and leads to an increase in the effective channel length of the MOS transistor. As described above, since at least one buffer trench region 125 is disposed between the upper and lower trench regions 115 and 130, dull corners C1 and C2 are formed between the upper and lower trench regions 115 and 130. In one embodiment, the dull corner C1 may be characterized as a convex region of the inner wall of the trench structure 133 located between the upper trench region 115 and the buffer trench region 125. Similarly, the dull corner C2 may be characterized as another convex region of the inner wall of the trench structure 133 between the buffer trench region 125 and the lower trench region 130. In one embodiment, the dull corners C1 and C2 may be "dull" at least to the extent that they define angles which are substantially less than 90 degrees. By providing dull corners C1 and C2 that define angles which are substantially less than 90 degrees, the gate dielectric layer 140 may be formed to a sufficient thickness at the first boundary region between the upper trench region 115 and the buffer trench region 125 and at the second boundary region between buffer trench region 125 and the lower trench region 130. Thus, the reliability of the gate dielectric layer 140 can be enhanced over the reliability of the gate dielectric layer described above with respect to the recess-channel transistor of Min.

Landing pads 160 may be disposed on the source and drain regions 157 of both sides of the gate electrode 145. In one embodiment, the landing pads 160 may include doped polysilicon, or the like. A lower interlayer insulating layer 165 may be disposed on the semiconductor substrate 100 having the landing pads 160. A direct contact plug 170 may penetrate the lower interlayer insulating layer 165 and contact one of the landing pads 160 disposed on both sides of the gate electrode 145. A conductive line 173 overlapping the direct contact plug 170 may be disposed on the lower interlayer insulating layer 165.

An upper interlayer insulating layer 180 may be disposed on the semiconductor substrate 100 having the conductive line 173. A buried contact plug 185 may sequentially penetrate the upper interlayer insulating layer 180 and the lower interlayer insulating layer 165 and contact one of the landing pads 160 disposed on both sides of the gate electrode 145. The buried contact plug 185 may be disposed opposite the direct contact plug 170 with the gate electrode 145 interposed therebetween. Thus, the buried contact plug 185 may be electrically connected to one of the source and drain regions 157 disposed on both sides of the gate electrode 145. A data storage element 190 overlapping the buried contact plug 185 may be disposed on the upper interlayer insulating layer 180. The data storage element 190 may be a capacitor that forms a DRAM cell. Thus, the data storage element 190 may include a lower electrode, a capacitor dielectric layer, and an upper electrode which are sequentially stacked.

A structure of a semiconductor device according to another exemplary embodiment of the present invention will now be described with reference to FIG. 10.

Referring to FIG. 10, an isolation layer 205s is disposed in a semiconductor substrate 200 to define an active region 205a. The active region 205a may have n-type or p-type conductivity. A trench structure 233 may be disposed in the active region 205a of the semiconductor substrate 200. The trench structure 233 may include trench regions, which are sequentially arranged from the surface of the active region 205a of the semiconductor substrate 200 and have different widths. Among the trench regions, trench regions disposed at lower levels below the surface of the active region 205a may generally have greater widths than trench regions disposed thereabove. Also, a boundary region between trench regions disposed at lower levels may have a greater width than a boundary region between trench regions disposed at higher levels. For example, the trench structure 233 may include an upper trench region 215, a buffer trench region 225, and a lower trench region 230. The upper trench region 215 may be disposed across the active region 205a, and the buffer trench region 225 may be disposed under the upper trench region 215 and have a greater width than the upper trench region 215. Also, the lower trench region 230 may be disposed under the buffer trench region 225 and have a greater width than the buffer trench region 225. Here, one or more buffer trench regions 225 may be prepared. For example, the buffer trench region 225 may include an upper buffer trench region 223a and a lower buffer trench region 223b.

A width D1 of a first boundary region between the upper trench region 215 and the upper buffer trench region 223a may be smaller than a width D2 of a second boundary region between the upper buffer trench region 223a and the lower buffer trench region 223b. Also, the width D2 may be smaller than a width D3 of a third boundary region between the lower buffer trench region 223b and the lower trench region 230. Thus, the buffer trench region 225 may prevent the upper and lower trench regions 215 and 230 from directly contacting each other. Accordingly, the buffer trench region 225 may prevent sharp corners from being formed between the upper and lower trench regions 215 and 230. A gate electrode 245 may be disposed in the trench structure 233. The gate electrode 245 may be a buried gate electrode 245. For example, the gate electrode 245 may be disposed in the trench structure 233 such that a top surface of the gate electrode 245 is at the same level as or at a lower level than the surface of the active region 205a. In this case, the gate electrode 245 may include doped polysilicon, metal nitride (e.g., titanium nitride), or the like or a combination thereof. An insulating pattern 247 may be formed on the buried gate electrode 245. A gate dielectric layer 240 may be interposed between the gate electrode 245 and the trench structure 233. The gate dielectric layer 240 may include, for example, silicon oxide layer, a high-k dielectric material, or the like or a combination thereof. Source and drain regions 257 may be disposed in the active region 205a on both sides of the gate electrode 245. A threshold voltage control region 207 may be disposed in the active region 205a. The threshold voltage control region 207 may be of an opposite conductivity type to the source and drain regions 257. The threshold voltage control region 207 may have the same conductivity type as the active region 205a and a different impurity concentration from the active region 205a. For example, the threshold voltage control region 207 may have a higher impurity concentration than the active region 205a. The threshold voltage control region 207 may surround a bottom region of the trench structure 233. Although not shown in the drawings, a data storage element, which is described above with reference to FIG. 8, may be disposed on the source and drain regions 257.

According to the embodiments exemplarily described above, semiconductor devices such as DRAMs, which employ MOS transistors, can be provided. The MOS transistors improve the reliability of the gate dielectric layers 140 and 240 and have recessed channel regions. Also, since the gate electrodes 145 and 245 of the MOS transistors are disposed within trench structures 133 and 233 having dull corners, the occurrence of an electric field crowding effect can be suppressed. By suppressing the occurrence of the electric field crowding effect that leads to a GIDL current, the data retention characteristics of the semiconductor devices such as DRAMs can be enhanced.

Hereinafter, exemplary methods of fabricating semiconductor devices according to aforementioned embodiments will now be described.

An exemplary method of fabricating a semiconductor device according to one embodiment will first be described with reference to FIGS. 1 through 8.

Figure 1:
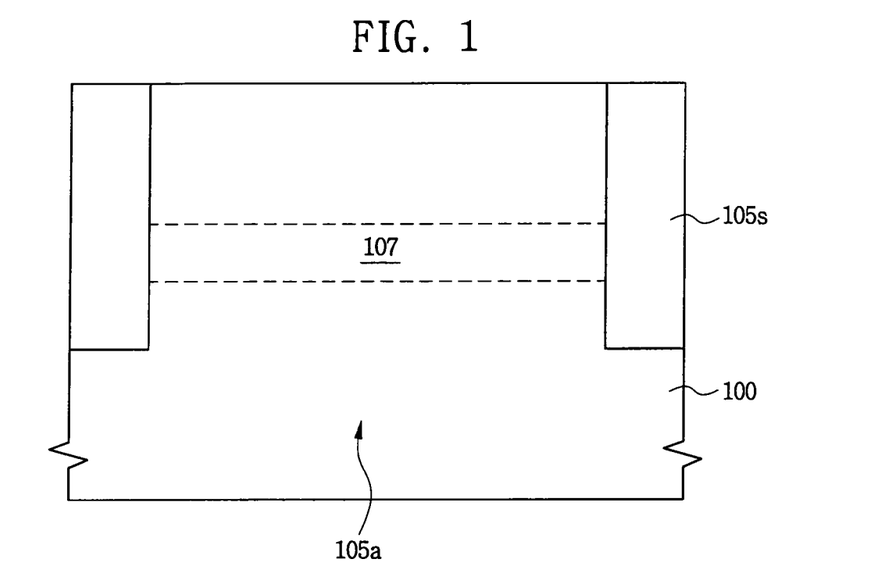
FIGS. 1 through 8 are cross-sectional views illustrating an exemplary method of fabricating a semiconductor device according to one embodiment.

Referring to FIG. 1, a semiconductor substrate 100 is prepared. The semiconductor substrate 100 may be a single crystalline silicon substrate. An isolation layer 105s may be formed in the semiconductor substrate 100 to define an active region 105a. The active region 105a may have n-type or p-type conductivity. The isolation layer 105s may be formed using, for example, a shallow trench isolation (STI) technique. The isolation layer 105s may include silicon oxide. A threshold voltage control region 107 may be formed in the active region 105a. The threshold voltage control region 107 may be surrounded by the isolation layer 105s as illustrated in FIG. 1. The threshold voltage control region 107 may have the same conductivity type as the active region 105a and a different impurity concentration from the active region 105a. For example, the threshold voltage control region 107 may have a higher impurity concentration than the active region 105a.

Figure 2:
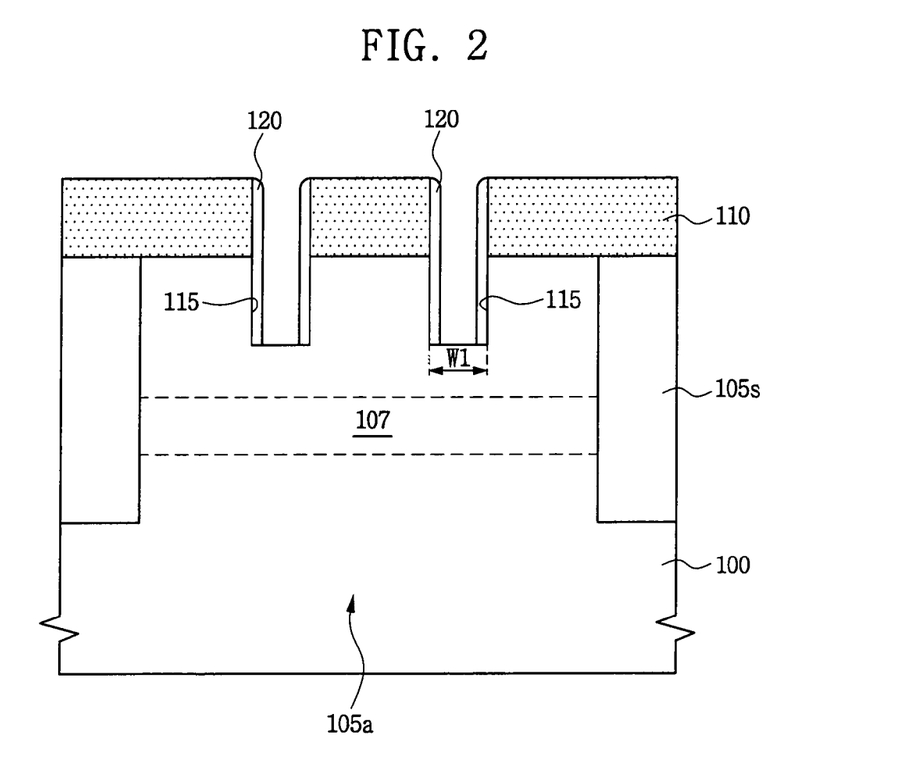

Referring to FIG. 2, a mask pattern 110 may be formed on the semiconductor substrate 100 having the threshold voltage control region 107. The mask pattern 110 may have an opening crossing the active region 105a. The mask pattern 110 may be formed of a material having an etch selectivity with respect to the isolation layer 105s. For example, when the isolation layer 105s includes silicon oxide, the mask pattern 110 may include silicon nitride.

In one embodiment, a pad oxide layer (not shown) may be formed on the semiconductor substrate 100 before forming the mask pattern 110. The pad oxide layer may include a thermal oxide layer, which is formed by a thermal oxidation process.

The active region 105a may be anisotropically etched using the mask pattern 110 as an etch mask. As a result, an upper trench region 115 may be formed to a first width W1 across the active region 105a. The upper trench region 115 may be formed to have a substantially vertical sidewall or a positively sloped sidewall. When the upper trench region 115 has the positively sloped sidewall, the upper trench region 115 may have a lower region that is narrower than an upper region.

A first spacer insulating layer may be formed on the semiconductor substrate 100 having the upper trench region 115. Thereafter, the first spacer insulating layer may be anisotropically etched to leave a first spacer 120 on a sidewall of the upper trench region 115 and a sidewall of the mask pattern 110. Thus, a bottom region of the upper trench region 115 may be exposed by the first spacer 120. The first spacer 120 may be formed of a material having an etch selectivity with respect to the mask pattern 110. For example, when the mask pattern 110 includes silicon nitride, the first spacer 120 may include silicon oxide.

Figure 3:
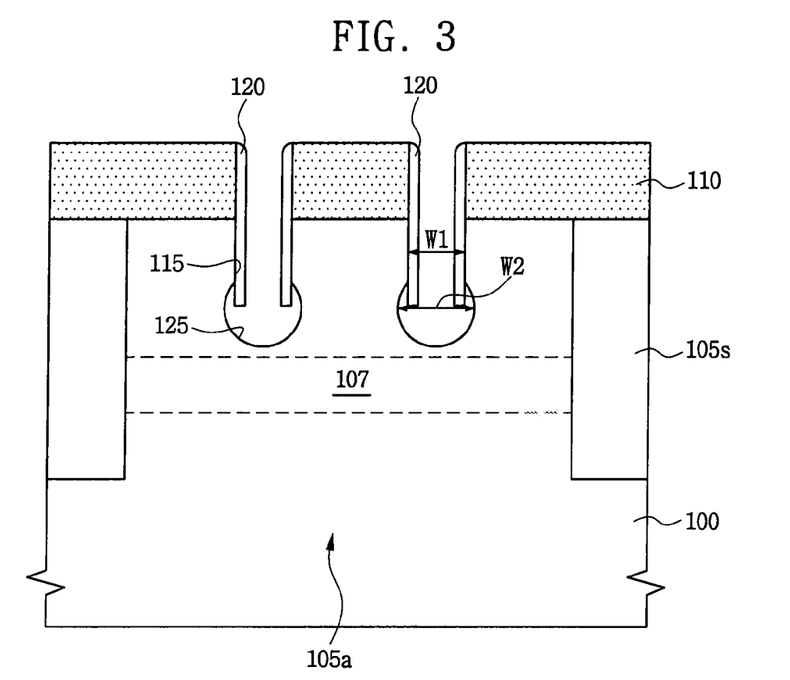

Referring to FIG. 3, the active region 105a may be isotropically etched using the mask pattern 110 and the first spacer 120 as an etch mask. In other words, the bottom region of the upper trench region 115 may be isotropically etched using the mask pattern 110 and the first spacer 120 as an etch mask. As a result, a buffer trench region 125 may be formed under the upper trench region 115 in the active region 105a. In one embodiment, the buffer trench region 125 may be formed to have a curved sidewall. The buffer trench region 125 may be formed to a greater width than the upper trench region 115. That is, the buffer trench region 125 may be formed to a second width W2 greater than the first width W1.

Figure 4:
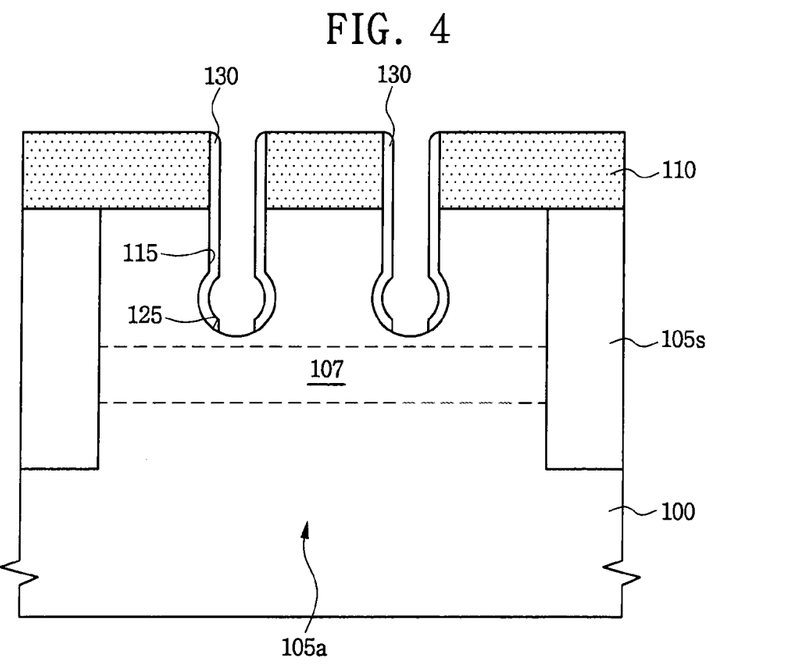

Referring to FIG. 4, the first spacer 120 may be selectively removed. A second spacer insulating layer may be formed on the substrate 100 from which the first spacer 120 is removed. Thereafter, the second spacer insulating layer may be anisotropically etched to leave a second spacer 130 on the sidewall of the buffer trench region 125, the sidewall of the upper trench region 115, and the sidewall of the mask pattern 110. Thus, a bottom region of the buffer trench region 125 may be exposed by the second spacer 130. The second spacer 130 may be formed of a material having an etch selectivity with respect to the mask pattern 110. For example, when the mask pattern 110 includes silicon nitride, the second spacer 130 may include silicon oxide.

In another embodiment, the second spacer 130 may be formed on the semiconductor substrate 100 having the first spacer 120. In such an embodiment, a second spacer insulating layer may be formed on the semiconductor substrate 100 having the first spacer 120 and then be anisotropically etched to leave the second spacer 130 on the sidewall of the buffer trench region 125 and an outer sidewall of the first spacer 120.

Figure 5:
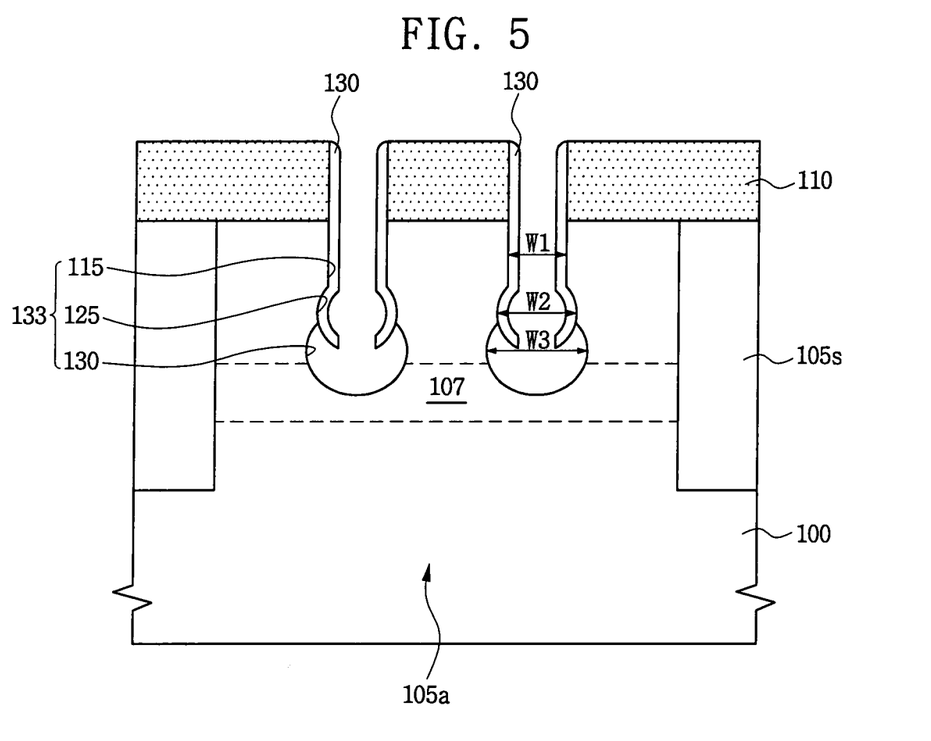

Referring to FIG. 5, the bottom region of the buffer trench region 125 may be isotropically etched using the mask pattern 110 and the second spacer 130 as an etch mask. Accordingly, a portion of the active region 105a disposed under the buffer trench region 125 may be isotropically etched using the mask pattern 110 and the second spacer 130 as an etch mask. As a result, a lower trench region 130 may be formed under the buffer trench region 125 to have a greater width than the buffer trench region 125. That is, the lower trench region 130 may be formed to have a third width W3 greater than the second width W2. A bottom region of the lower trench region 130 may be disposed in the threshold voltage control region 107. Thus, the bottom region of the lower trench region 130 may be surrounded by the threshold voltage control region 107.

Although not shown, at least one additional buffer trench region may be formed before forming the lower trench region 130. In such an embodiment, the at least one additional buffer trench region may be formed by the same method as that of forming the lower trench region 130. The additional buffer trench region may be formed to a greater width than the buffer trench region 125 and a smaller width than the lower trench region 130. Accordingly, one or more buffer trench regions 125 may be formed between the lower trench region 130 and the upper trench region 115.

In this process, a trench structure 133 including at least three trench regions that are sequentially arranged from the surface of the active region 105a and have different widths may be formed. Thus, the trench structure 133 may include the upper trench region 115, the at least one buffer trench region 125, and the lower trench region 130, which are sequentially arranged from the surface of the active region 105a and have different widths.

Figure 6:
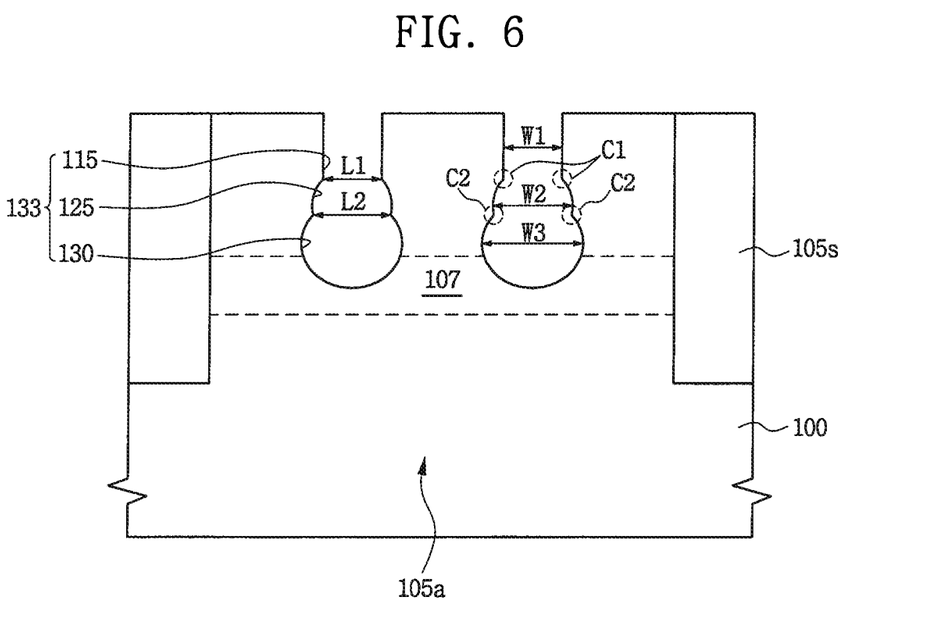

Referring to FIG. 6, the second spacer 160 and the mask pattern 110 may be removed. As a result, an inner wall of the trench structure 133 and the surface of the active region 105a may be exposed. The trench structure 133 may have dull corners C1 and C2 disposed on an inner wall thereof. Specifically, as shown in FIG. 6, a first boundary region may be formed between the upper trench region 115 and the buffer trench region 125 and a second boundary region may be formed between the buffer trench region 125 and the lower trench region 130. As illustrated, a width L2 of the second boundary region may be greater than a width L1 of the first boundary region.

Since at least one buffer trench region 125 is interposed between the upper trench region 115 and the lower trench region 130, dull corners C1 and C2 may be formed at the first and second boundary regions. Thus, even if the dimension of the lower trench region 130 is increased, the buffer trench region 125 can prevent sharp corners from being formed in the trench structure 133.

Referring to FIG. 7, a gate dielectric layer 140 may be formed on the inner wall of the trench structure 133 and the exposed surface of the active region 105a of the semiconductor substrate 100. The gate dielectric layer 140 may include, for example, silicon oxide formed using a thermal oxidation process. In another embodiment, the gate dielectric layer 140 may include a high-k dielectric material having a higher dielectric constant than silicon oxide.

A gate electrode 145 may be formed on the gate dielectric layer 140 to fill the trench structure 145. The gate electrode 145 may fill the trench structure 133 and protrude above the surface of the active region 105a. The gate electrode 145 may include a material such as doped polysilicon.

A metal silicide pattern 147 and a capping mask 150 may be sequentially formed on the gate electrode 145. For example, a gate layer and a metal silicide layer may be sequentially formed on the semiconductor substrate 100 having the gate dielectric layer 140, and the capping mask 150 may be formed on the metal silicide layer. The metal silicide layer and the gate layer may be sequentially patterned using the capping mask 150 as an etch mask, thereby forming the gate electrode 145 and the metal silicide pattern 147 on the gate dielectric layer 140. In one embodiment, the gate electrode 145 may fill the trench structure 133 and protrude above the surface of the active region 105a, and the metal silicide pattern 147 may be self-aligned with the gate electrode 145.

Impurity ions having a different conductivity type from the active region 105a may be implanted into the active region 105a using the capping mask 150 and the isolation layer 105s as an ion implantation mask so that lightly doped regions may be formed in the active region 105a on both sides of the gate electrode 145.

A gate spacer 155 may be formed on a sidewall of the capping mask 150, a sidewall of the metal silicide pattern 147, and a sidewall of the gate electrode 145 that protrudes from the surface of the active region 105a. The gate spacer 155 may include silicon oxide, silicon nitride, or the like or a combination thereof.

Impurity ions having a different conductivity type from the active region 105a may be implanted into the active region 105a using the capping mask 150, the gate spacer 155, and the isolation layer 105s as an ion implantation mask so that heavily doped regions may be formed in the active region 105a on both sides of the gate electrode 145. The lightly doped regions and the heavily doped regions may be defined as source and drain regions 157.

In one embodiment, the metal silicide pattern 147 may be formed after forming the source and drain regions 157. For example, after removing the capping mask 150 and forming the source and drain regions 157, the metal silicide pattern 147 may be formed on the gate electrode 145 using the isolation layer 105s and the gate spacer 155 as a silicide mask. During the formation of the metal silicide pattern 147, silicide source and drain regions may be formed on the source and drain regions 157.

Referring to FIG. 8, landing pads 160 are formed on the source and drain regions 157 using a self-aligned contact technique. For example, an insulating layer may be formed on the semiconductor substrate 100 having the source and drain regions 157 and then patterned to form pad holes exposing the source and drain regions 157. Thereafter, a conductive layer may be formed on the semiconductor substrate 100 having the pad holes and then planarized until the insulating layer is exposed. As a result, landing pads 160 may be left in the pad holes.

A lower interlayer insulating layer 165 may be formed on the semiconductor substrate 100 having the landing pads 160. The lower interlayer insulating layer 165 may be a silicon oxide layer. A direct contact plug 170 may be formed through the lower interlayer insulating layer 165 and contact the landing pad 160 formed on one of the source and drain regions 157. A conductive line 173 overlapping the direct contact plug 170 may be formed on the lower interlayer insulating layer 165.

An upper interlayer insulating layer 180 may be formed on the semiconductor substrate 100 having the conductive line 173. The upper interlayer insulating layer 180 may include, for example, silicon oxide. A buried contact plug 185 may be formed through the upper and lower interlayer insulating layers 180 and 165 and brought into contact with one of the landing pads 160 formed on both sides of the gate electrode 145. The buried contact plug 185 may be electrically connected to one of the source and drain regions 157 formed on both sides of the gate electrode 145. A data storage element 190 may be formed on the upper interlayer insulating layer 180 and overlap the buried contact plug 185. The data storage element 190 may include a capacitor that forms a DRAM cell. Thus, the data storage element 190 may include a lower electrode, a capacitor dielectric layer, and an upper electrode which are sequentially stacked.

Hereinafter, an exemplary method of fabricating a semiconductor device according to another embodiment will be described with reference to FIGS. 9 and 10.

Referring to FIG. 9, an isolation layer 205s may be formed in a semiconductor substrate 200 to define an active region 205a. A threshold voltage control region 207 may be formed in the active region 205a. An upper trench region 215, an upper buffer trench region 223a having a greater width than the upper trench region 215, and a lower buffer trench region 223b having a greater width than the upper buffer trench region 223a may be formed in the active region 205a using substantially the same method as the method of forming the trench structure 133 as described with reference to FIGS. 1 through 6. Here, the upper buffer trench region 223a and the lower buffer trench region 223b may be collectively referred to as a buffer trench region 225.

Thereafter, a lower trench region 230 having a greater width than the buffer trench region 225 may be formed using substantially the same method as the method of forming the lower trench region 130 as described with reference to FIG. 5. For example, a sacrificial spacer (not shown) may be formed on a sidewall of the upper trench region 215 and a sidewall of the buffer trench region 225, and a portion of the active region 205a exposed by the sacrificial spacer under the buffer trench region 225 may be isotropically etched to form the lower trench region 230. Thus, a trench structure 233 including the upper trench region 215, the buffer trench region 225, and the lower trench region 230, may be formed. A bottom region of the trench structure 233 may be disposed in the threshold voltage control region 207.

A width D1 of a first boundary region between the upper trench region 215 and the upper buffer trench region 223a may be smaller than a width D2 of a second boundary region between the upper buffer trench region 223a and the lower buffer trench region 223b. Also, the width D2 of the second boundary region may be smaller than a width D3 of a third boundary region between the lower buffer trench region 223b and the lower trench region 230. Thus, the trench structure 233 may have dull corners B1, B2, and B3 disposed at different levels along an inner wall thereof.

Referring to FIG. 10, a gate dielectric layer 240 may be formed on the semiconductor substrate 200 having the trench structure 233. The gate dielectric layer 240 may include, for example, silicon oxide, a high-k dielectric material, or the like or a combination thereof. A buried gate electrode 245 may be formed to fill the trench structure 233 in the semiconductor substrate 200 having the gate dielectric layer 240. A top surface of the buried gate electrode 245 may be disposed at substantially the same level as, or at a lower level than, the surface of the active region 205a. When the top surface of the buried gate electrode 245 is disposed at a lower level than the surface of the active region 205a (i.e., below the surface of the active region 205a), an insulating pattern 247 may be formed on the buried gate electrode 245. Source and drain regions 257 may be formed in the active region 205a on both sides of the buried gate electrode 245. Thereafter, although not shown in the drawings, a data storage element may be formed by substantially the same method as described with reference to FIG. 8. The data storage element may be electrically connected to one of the source and drain regions 257.

According to embodiments exemplarily described above, an upper trench region, a buffer trench region, and a lower trench region may be sequentially formed below the surface of an active region to have different widths. Among the trench regions, a trench region disposed at a lower level below the surface of the active region has a greater width. Also, a boundary region between trench regions disposed at lower levels has a greater width than a boundary region between trench regions disposed at higher levels. Thus, dull corners are formed at the boundary regions between adjacent trench regions. As a result, embodiments of the present invention provide a semiconductor device employing a MOS transistor having a recessed channel region, which can improve the reliability of a gate dielectric layer.

What follows are examples of non-limiting embodiments of the present invention.

In one embodiment, a semiconductor device employing a MOS transistor having a recessed channel region includes a trench structure including an upper trench region, a buffer trench region, and a lower trench region that are sequentially arranged from the surface of an active region of a semiconductor substrate and have different widths. A gate electrode is disposed in the trench structure. A gate dielectric layer is interposed between the gate electrode and the trench structure.

The trench structure may include at least one buffer trench region.

A trench region disposed at a lower level among the upper trench region, the buffer trench region, and the lower trench region may have a greater width. Here, a boundary region between trench regions disposed at lower levels may have a greater width than a boundary region between trench regions disposed at higher levels.

The trench structure may cross the active region.

The buffer trench region may have a curved sidewall.

The lower trench region may have a curved sidewall and a curved bottom region.

The gate electrode may fill the trench structure and protrude from the active region.

The gate electrode may be buried in the trench structure.

The semiconductor device may further include a threshold voltage control region disposed in the active region. The threshold voltage control region may surround a bottom region of the trench structure.

The semiconductor device may further include source and drain regions disposed in the active region on both sides of the gate electrode.

Also, the semiconductor device may further include a data storage element electrically connected to one of the source and drain regions.

In another embodiment of the present invention, a method of fabricating a semiconductor device employing a MOS transistor having a recessed channel region may include forming a trench structure in an active region of a semiconductor substrate. The trench structure includes an upper trench region, a buffer trench region, and a lower trench region that are sequentially arranged from the surface of the active region and have different widths. A gate dielectric layer is formed on the semiconductor substrate having the trench structure. A gate electrode is formed on the gate dielectric layer to fill the trench structure.

The trench structure may be formed such that a trench region formed at a lower level among the upper trench region, the buffer trench region, and the lower trench region has a greater width. Here, a boundary region between trench regions formed at lower levels may have a greater width than a boundary region between trench regions formed at higher levels.

The trench structure may be formed across the active region.

The buffer trench region may be formed to have a curved sidewall.

The lower trench region may be formed to have a curved sidewall and a curved bottom region.

The formation of the trench structure may include forming a mask pattern on the semiconductor substrate. The mask pattern is formed to have an opening formed across the active region. The active region may be anisotropically etched using the mask pattern as an etch mask to form the upper trench region having a first width. A first spacer may be formed on a sidewall of the upper trench region. The active region disposed under the upper trench region may be isotropically etched using the mask pattern and the first spacer as an etch mask to form the buffer trench region having a greater width than the upper trench region. The first spacer may be removed. A second spacer may be formed on a sidewall of the upper trench region and a sidewall of the buffer trench region. The active region disposed under the buffer trench region may be isotropically etched using the mask pattern and the second spacer as an etch mask to form the lower trench region having a greater width than the buffer trench region. Thereafter, the mask pattern and the second spacer may be removed.

After removing the first spacer, a sacrificial spacer may be formed on the sidewall of the upper trench region and the sidewall of the buffer trench region. The active region disposed under the buffer trench region may be isotropically etched using the mask pattern and the sacrificial spacer as an etch mask to form a lower buffer trench region having a greater width than the buffer trench region. Thereafter, the sacrificial spacer may be removed. In this case, the lower buffer trench region may be formed to a smaller width than the lower trench region.

The gate electrode may be formed to fill the trench structure and protrude from the active region.

The gate electrode may be buried in the trench structure.

Before forming the trench structure, a threshold voltage control region may be further formed in the active region of the semiconductor substrate to surround a bottom region of the trench structure.

Also, source and drain regions may be further formed in the active region on both sides of the gate electrode.

Moreover, a data storage element may be further formed such that the data storage element is electrically connected to one of the source and drain regions.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device comprising:
a semiconductor substrate having an active region;
a trench structure defined within the active region, the trench structure including an upper trench region adjacent to a surface of the active region and having a lower boundary located at a first corner of inner walls of the trench structure and oriented in a plane substantially parallel with the surface of the active region, a lower trench region having an upper boundary located at a second corner of the inner walls of the trench structure and oriented in a plane substantially parallel with the surface of the active region, and a buffer trench region interposed between the lower boundary of the upper trench region and the upper boundary of the lower trench region, wherein a width of the lower trench region is greater than a width of the upper trench region and wherein the inner walls of the trench structure are curved throughout the lower trench region and throughout the buffer trench region;
a gate electrode disposed in the trench structure; and
a gate dielectric layer interposed between the gate electrode and the trench structure.

2. The device according to claim 1, wherein the trench structure comprises a plurality of buffer trench regions interposed between the upper trench region and the lower trench region.

3. The device according to claim 1, wherein the width of the lower trench region is greater than a width of the buffer trench region.

4. The device according to claim 3, wherein a width of a first boundary region between the upper trench region and the buffer trench region is less than a width of a second boundary region between the buffer trench region and the lower trench region.

5. The device according to claim 1, wherein the trench structure crosses the active region.

6. The device according to claim 1, wherein the buffer trench region has a curved sidewall.

7. The device according to claim 1, wherein the lower trench region has a curved sidewall and a curved bottom region.

8. The device according to claim 1, wherein the gate electrode fills the trench structure and protrudes above the surface of the active region.

9. The device according to claim 1, wherein the gate electrode is buried in the trench structure.

10. The device according to claim 1, further comprising a threshold voltage control region disposed in the active region,
wherein the threshold voltage control region surrounds a bottom region of the trench structure.

11. The device according to claim 1, further comprising source and drain regions disposed in the active region on opposite sides of the gate electrode.

12. The device according to claim 11, further comprising a data storage element electrically connected to one of the source and drain regions.

13. A recess channel transistor comprising:
a semiconductor substrate having an active region;
a trench within the active region, the trench including an upper trench region adjacent to a surface of the active region and having a lower boundary located at a first corner of inner walls of the trench and oriented in a plane substantially parallel with the surface of the active region, a lower trench region having an upper boundary located at a second corner of the inner walls of the trench structure and oriented in a plane substantially parallel with the surface of the active region, and a buffer trench region interposed between the lower boundary of the upper trench region and the upper boundary of the lower trench region, wherein a width of the lower trench region is greater than a width of the upper trench region and wherein the inner walls of the trench structure are curved throughout the lower trench region and throughout the buffer trench region;
a gate electrode in the trench;
a gate dielectric layer in the trench between the gate electrode and the inner wall of the trench; and
source and drain regions in the active region on respective opposite sides of the trench and directly adjacent the trench.

14. The recess channel transistor according to claim 13, wherein the trench comprises a plurality of buffer trench regions interposed between the upper trench region and the lower trench region.

15. The recess channel transistor according to claim 13, wherein the lower trench region has a curved bottom region.

16. The recess channel transistor according to claim 13, wherein the gate electrode fills the trench and protrudes above the surface of the semiconductor substrate.

17. The recess channel transistor according to claim 13, wherein the gate electrode is buried in the trench structure with an insulating pattern on the gate electrode.

18. The device according to claim 13, further comprising a data storage element electrically connected to one of the source and drain regions.

19. A recess channel transistor comprising:
a semiconductor substrate having a first surface and an active region;
a trench extending from the first surface into the semiconductor substrate within the active region, the trench including an upper trench region adjacent to the first surface of the semiconductor substrate and having a lower boundary located at a first corner of sidewalls of the trench and oriented in a first plane substantially parallel with the first surface of the semiconductor substrate, a lower trench region having an upper boundary located at a second corner of the sidewalls of the trench structure and oriented in a second plane substantially parallel with the first surface of the semiconductor substrate, and a buffer trench region interposed between the lower boundary of the upper trench region and the upper boundary of the lower trench region, wherein a sidewall of the trench in the upper trench region extends along a plane that is substantially perpendicular to the first surface of the semiconductor substrate, and the sidewall of the trench in the buffer trench region is curved,
wherein a width of the lower trench region is greater than a width of the upper trench region,
the sidewalls of the trench in the buffer trench region at the first corner curve away from the sidewalls of the trench at the upper trench region at respective angles substantially less than 90 degrees so that a width of the buffer trench region is greater than a width of the upper trench region;
a gate electrode in the trench;
a gate dielectric layer in the trench between the gate electrode and the inner wall of the trench; and
source and drain regions in the active region on respective opposite sides of the trench and directly adjacent the trench.

20. The recess channel transistor according to claim 19, wherein the sidewalls of the trench in the lower trench region at the second corner curve away from the sidewalls of the trench in the buffer trench region at respective angles of substantially less than 90 degrees.

* * * * *